United States Patent [19]
Koshikawa

[11] Patent Number: 5,428,299
[45] Date of Patent: Jun. 27, 1995

[54] SEMICONDUCTOR INTEGRATED CIRCUIT DEVICE HAVING LOW POWER CONSUMPTION VOLTAGE MONITORING CIRCUIT FOR BUILT-IN STEP-DOWN VOLTAGE GENERATOR

[75] Inventor: Yasuji Koshikawa, Tokyo, Japan

[73] Assignee: NEC Corporation, Tokyo, Japan

[21] Appl. No.: 202,159

[22] Filed: Feb. 25, 1994

[30] Foreign Application Priority Data

Feb. 26, 1993 [JP] Japan .................................. 5-062658

[51] Int. Cl.⁶ .............................................. G01R 1/04
[52] U.S. Cl. .................................. 324/763; 324/158.1
[58] Field of Search ........................ 365/180–220; 324/755, 763, 158.1

[56] References Cited

U.S. PATENT DOCUMENTS 5,272,393  12/1993  Horiguchi et al. .
5,309,399   5/1994  Murotani ........................ 365/189.09
5,319,302   6/1994  Koshikawa et al. .

FOREIGN PATENT DOCUMENTS 2680585  7/1992  France .
0454170  10/1991  Japan .

*Primary Examiner*—Kenneth A. Wieder
*Assistant Examiner*—Barry C. Bowser
*Attorney, Agent, or Firm*—Sughrue, Mion, Zinn, Macpeak & Seas

[57] ABSTRACT

A semiconductor integrated circuit device produces an internal step-down power voltage from an external voltage for selectively distributing the internal step-down power voltage and the external voltage to the circuit components thereof, and a built-in step-down voltage generator has two internal voltage generating circuits selectively enabled with a control signal for a standard data access mode and a burn-in test operation, wherein a premonitoring circuit activates a current mirror circuit for producing the control signal when the external voltage becomes close to an accelerating voltage range for the burn-in test operation, thereby decreasing standby current in the standard data access mode.

6 Claims, 8 Drawing Sheets

SEMICONDUCTOR INTEGRATED CIRCUIT DEVICE HAVING LOW POWER CONSUMPTION VOLTAGE MONITORING CIRCUIT FOR BUILT-IN STEP-DOWN VOLTAGE GENERATOR

FIELD OF THE INVENTION

This invention relates to a semiconductor integrated circuit device and, more particularly, to a semiconductor integrated circuit device having a low power consumption voltage monitoring circuit for built-in step-down voltage generator.

DESCRIPTION OF THE RELATED ART

The semiconductor integrated circuit device such as a semiconductor memory device progressively increases the integration density through miniaturization of the circuit components. However, miniaturized transistors encounter a problem in reliability due to hot carriers and short the channel effect. The problem is avoidable by decreasing a power voltage level. However, it is impossible to decrease the power voltage level for only the semiconductor memory device, because a dual power supply system is complex and expensive.

In order to share a single power supply system between the semiconductor memory device and the other system components without the problem, it is proposed to provide a built-in step-down voltage generator in the semiconductor memory device. The built-in step-down voltage generator is arranged in such a manner as to keep the output voltage level or the internal step-down power voltage at a constant voltage level after the external power voltage exceeds a predetermined voltage level, typically, at 3.5 volts.

However, such an built-in step-down voltage generator is not desirable for a burn-in test operation, because the built-in step-down voltage generator prevents the circuit components from an excess voltage for the burn-in test operation.

A built-in step-down voltage generator acknowledges the burn-in test operation when a diagnostic system applies an excess voltage over a recommended voltage range to a power voltage pin of the semiconductor memory device, and allows the internal power voltage to rise over the constant level depending upon the applied voltage level.

FIG. 1 illustrates a typical example of the semiconductor memory device with the built-in step-down voltage generator. Reference numeral 1 designates the built-in step-down voltage generator, and is broken down into a first internal voltage generating circuit 2 and a second internal voltage generating circuit 3. Though not shown in the figure, a voltage monitoring circuit checks an external voltage pin whether or not the external voltage Vext exceeds the recommended voltage range, and changes a control signal Sdc from a low voltage level to a high voltage level when the external voltage is lifted over the recommended voltage range for the burn-in test operation. The control signal Sdc and the complementary signal CSdc complementarily enable the first internal voltage generating circuit 2 and the second internal voltage generating circuits 3.

The first internal voltage generating circuit 2 comprises a current mirror circuit 2a coupled between a non-step-down power voltage line VEXT and a ground voltage line, a p-channel enhancement type make-up transistor Qp1 coupled between the non-step-down power voltage line VEXT and an output node N1 of the current mirror circuit 2a, a p-channel enhancement type load transistor Qp2 coupled between the non-step-down power voltage line VEXT and an internal power voltage line VINT, and an inverter 2b for producing the complementary signal CSdc. A reference voltage signal VR is supplied from an internal reference voltage generator (not shown) to a reference node of the current mirror circuit 2a, and the reference voltage signal VR is indicative of a target step-down voltage level.

While the external voltage level remains in the recommended voltage range, the voltage monitoring circuit keeps the control signal Sdc in the low voltage level, and the inverter 2b enables the current mirror circuit 2a with the complementary signal CSdc. The current mirror circuit 2a compares an internal power voltage level Vint with the reference voltage signal VR, and causes the p-channel enhancement type load transistor Qp2 to regulate the internal power voltage Vint to the target step-down voltage level.

On the other hand, the second internal voltage generating circuit 3 comprises a current mirror circuit 3a coupled between the non-step-down power voltage line VEXT and the ground voltage line, a voltage divider 3b also coupled between the non-step-down voltage line VEXT and the ground voltage line, a p-channel enhancement type make-up transistor Qp3, a p-channel enhancement type load transistor Qp4 and an inverter 3c for restoring the control signal Sdc. The voltage divider 3b is implemented by a resistor string R1, and regulates a variable reference voltage to five seventh of the external voltage level Vext on the non-step-down voltage line VEXT.

When the semiconductor memory device is subjected to an inspection through the burn-in test operation, the external voltage Vext at 8 volts is applied through the power voltage pin to the non-step-down voltage line VEXT. The voltage monitoring circuit acknowledges the external voltage level Vext to exceed the recommended voltage range, and shifts the control signal Sdc to the high voltage level. The inverter 3c restores the control signal Sdc of the high voltage level, and the control signal Sdc enables the current mirror circuit 3a. The voltage divider 3b supplies the variable reference voltage at five seventh of the external voltage Vext, i.e., 5.7 volts to the current mirror circuit 3a, and the current mirror circuit 3a causes the p-channel enhancement type load transistor Qp4 to regulates the internal power voltage Vint to the variable reference voltage.

The prior art built-in step-down voltage generator thus arranged changes and keeps the internal power voltage Vint depending upon the external voltage level Vext as shown in FIG. 2. Namely, while the external voltage level Vext is rising toward 3.5 volts, the first internal voltage generating circuit 2 causes the internal power voltage Vint to follow the external power voltage Vext. The first internal voltage generating circuit 2 keeps the internal power voltage Vint at the target level represented by the reference voltage signal VR in the voltage range between 3.5 volts and 6 volts.

When the external power voltage level Vext exceeds 6.0 volts, the voltage monitoring circuit: switches the control signal Sdc from the low level to the high level, and the control signal Sdc changes the first internal voltage generating circuit 2 to the second internal voltage generating circuit 2b. As a result, the second internal voltage generating circuit 3 increases the internal power voltage level Vint in proportion to the external voltage level Vext at five seventh. The internal power voltage Vint thus increased is used as an accelerating voltage in the burn-in test operation.

Therefore, the voltage monitoring circuit is indispensable for the prior art built-in step-down voltage generator, and FIG. 3 illustrates a typical example of the voltage monitoring circuit. Reference numeral 4 designates a prior art voltage monitoring circuit, and comprises a voltage comparator 4, a voltage divider 4b and an inverter 4c. The voltage divider 4c produces an input voltage signal Sin proportional to the external voltage level VEXT, and the voltage comparator 4a changes an output voltage signal thereof in inverse proportion to the input voltage signal Sin. When the output voltage signal exceeds the threshold of the inverter 4c, the control signal Sdc is shifted from the low voltage level to the high voltage level.

The voltage divider 4b is implemented by a resistor string coupled between the non-step-down voltage line VEXT and the ground voltage line, and the input voltage signal Sin is produced at an intermediate node N2 between resistors R2 and R3 of the resistor string. The input voltage signal Sin is given by Equation 1

$$Sin = [Vext \times r3/(r2+r3)] \qquad \text{Equation 1}$$

where r2 and r3 are resistances of the resistors R2 and R3.

The voltage comparator 4a is implemented by a current mirror circuit, and comprises a series combination of a p-channel enhancement type load transistor Qp5 and an n-channel enhancement type load transistor Qn6, a series combination of a p-channel enhancement type load transistor Qp7 and an n-channel enhancement type load transistor Qn8, and a constant current source implemented by an n-channel enhancement type field effect transistor Qn9 with a gate electrode coupled with a constant voltage line. The series combinations are coupled between the non-step-down voltage line VEXT and a common node N3, and the n-channel enhancement type field effect transistor Q9 is coupled between the common node and the ground voltage line. The gate electrodes of the p-channel enhancement type load transistors Qp5 and Qp7 are connected with the drain node N4 of the n-channel enhancement type load transistor Qn6, and the channel resistances thereof are concurrently changed depending upon the voltage level at the drain node N4.

The reference voltage signal. VR is applied to the gate electrode of the n-channel enhancement type load transistor Qn6, and provides a constant resistance against current passing therethrough. The input voltage signal Sin is applied to the gate electrode of the n-channel enhancement type load transistor Qn8, and the amount of current passing therethrough is variable depending upon the difference between the channel resistances of the n-channel enhancement type load transistors Qn6 and Qn8. The current passing through the n-channel enhancement type load transistor Qn8 is converted to the output voltage signal, and, for this reason, the output voltage signal of the voltage comparator 4a is inversely proportional to the input voltage signal Sin.

The output voltage signal is supplied to the input node of the inverter 4c, and keeps the control signal Sdc low while the reference voltage signal VR is greater than the input voltage level Sin, i.e., Vext $\times$ r3/(r2+r3). However, after the input voltage signal Sin exceeds the reference voltage signal VR, the inverter 4c changes the control signal Sdc from the low voltage level to the high voltage level. If the ratio between r2 and r3 is 1:1, the inverter changes the: control signal Sdc to the high voltage level at V1 (see FIG. 4), and the second internal voltage generating circuit 3 starts the internal power voltage Vint to follow the external voltage level Vext at V2 for the burn-in test operation.

The voltage comparator 4a implemented by the current mirror circuit has the accuracy high enough to discriminate a lower limit of the accelerating voltage used in the burn-in test operation from the upper limit of the recommended voltage range. The lower limit of the accelerating voltage is usually close to the upper limit of the recommended voltage range. For example, a dynamic random access memory device has the upper limit at 5.5, and the accelerating voltage is available for the burn-in test operation over the lower limit at 6.5 volts.

Thus, the voltage comparator 4a implemented by the current mirror circuit is desirable for the voltage monitoring circuit. However, a problem is encountered in the voltage monitoring circuit in a standby current.

In detail, a low electric power consumption is another goal of the semiconductor memory device, and the manufacturer makes efforts on reduction of the electric power consumption, especially, on reduction of the standby current in idling state thereof. While the semiconductor memory device is in the idling state, most of the electric power consumption or most of the standby current is consumed by the internal reference voltage generator, the built-in step-down voltage generator and the voltage monitoring circuit 4. As a result, the amount of standby current Iccs is proportionally increased with the external voltage level Vext as shown in FIG. 4, and the standby current at Vext=5 volts is as large as 100 micro-ampere.

It is necessary for the semiconductor memory device to produce the control signal Sdc from the external voltage Vext, and the voltage monitoring circuit 4 should be enabled at all times. The current mirror circuit is desirable for the voltage monitoring circuit 4 because of the high accuracy. However, the current mirror circuit consumes a large amount of current. For this reason, the manufacturer hardly decreases the standby current.

SUMMARY OF THE INVENTION

It is therefore an important object of the present invention to provide a semiconductor integrated circuit device which is small in standby current.

To accomplish the object, the present invention proposes to enable a voltage monitoring circuit after an external power voltage exceeds a predetermined voltage level.

In accordance with the present invention, there is provided a semiconductor integrated circuit device selectively entering into a standard operation mode powered with an external voltage variable within a standard voltage range and an inspection mode powered with the external voltage in an accelerating voltage range over the standard voltage range, comprising: a) a main function block powered with at least an internal power voltage for achieving tasks; b) a reference voltage generator powered with the external voltage for producing a reference voltage signal maintained substantially constant after the external voltage reaches the standard voltage range; c) a premonitoring circuit operative to compare the external voltage with the reference voltage signal whether or not the external voltage; exceeds a predetermined level between the standard voltage range and the accelerating voltage range, the premonitoring circuit keeping an enable signal in an inactive level before the external voltage exceeds the predetermined voltage level, the premonitoring circuit changing the enable signal to an active level when the external voltage exceeds the predetermined voltage level; d) a voltage monitoring circuit enabled with the enable signal for comparing an input voltage signal indicative of the level of the external voltage with the reference voltage signal, and operative to shift a control signal from an inactive level to an active level when input voltage signal indicates that the external voltage reaches the accelerating voltage range, the voltage monitoring circuit keeping the control signal in the inactive level without current consumption while the enable signal is in the inactive level; and e) a step-down voltage generating circuit operative to keep the internal voltage substantially constant while the control signal is in the inactive level, the step-down voltage generating circuit being responsive to the control signal of the active level for increasing the internal power voltage together with the external voltage.

The voltage monitoring circuit may have a current mirror circuit for comparing the input voltage signal with the reference voltage signal.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 5:
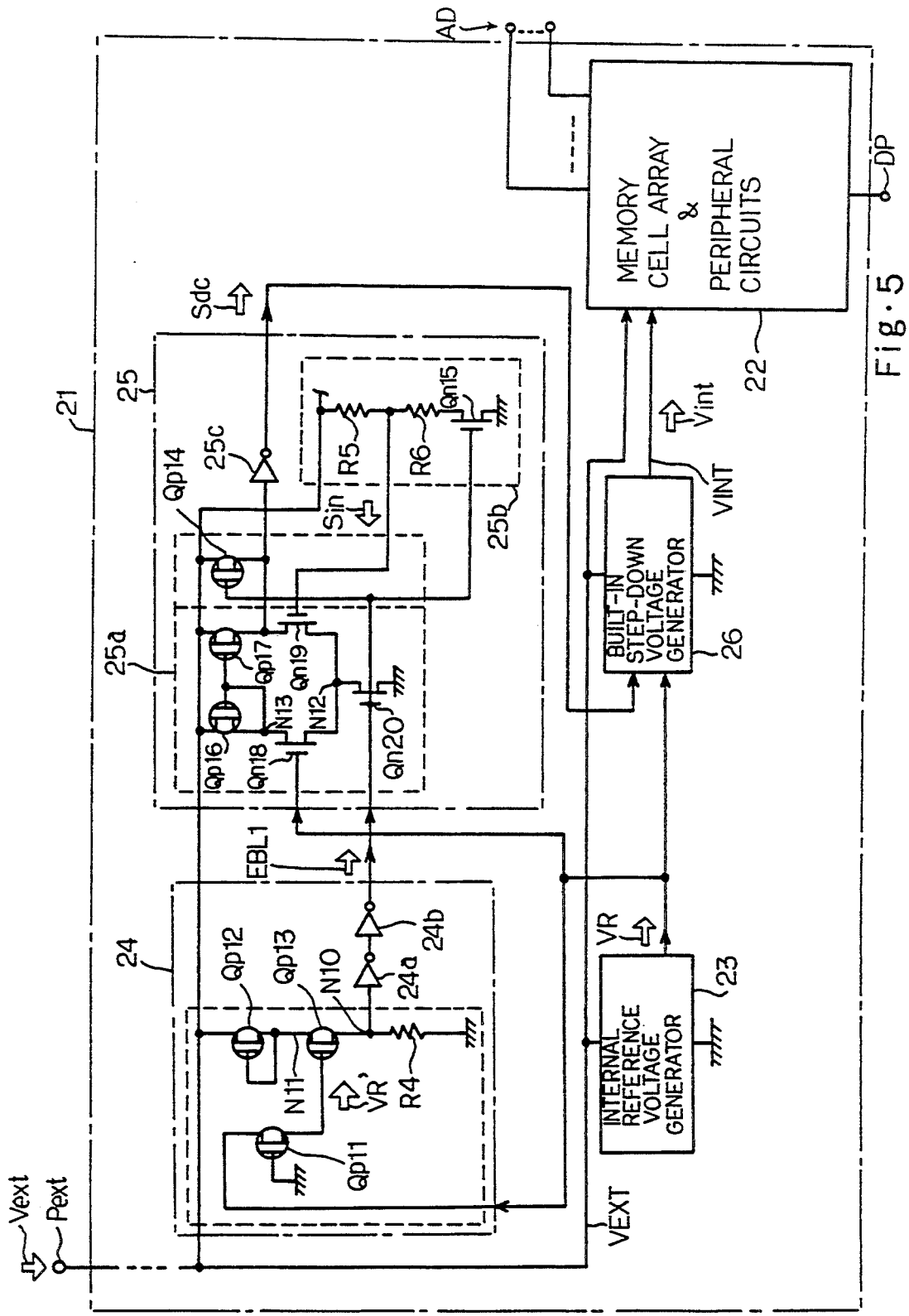
FIG. 5 is a circuit diagram showing the arrangement of a semiconductor memory device according to the present invention.

Referring to FIG. 5 of the drawings, a semiconductor memory device embodying the present invention is fabricated on a semiconductor chip 21, and is powered by an external power voltage Vext at a power supply pin Pext.

The semiconductor memory device embodying the present invention comprises a memory cell array and peripheral circuits 22, and the external power voltage Vext and an internal power voltage Vint are supplied through a non-step-down power voltage line VEXT and a step-down power voltage line VINT to the memory cell array and the peripheral circuits 22. The internal power voltage level Vint is lower than the external power voltage level Vext, and the internal power voltage Vint and the external power voltage Vext are selectively supplied to the circuit components of the memory cell array and the peripheral circuits 22. For this reason, the miniaturized transistors incorporated therein are free from hot electrons and the short channel effect.

The semiconductor memory device is subjected to inspections before delivery, and a burn-in test operation in one of the inspections accelerates failures under an accelerating voltage higher than the internal power voltage produced from the external voltage Vext in a recommended voltage range. In this instance, the recommended voltage range is $5 \pm 0.5$ volts, and an accelerating voltage range is higher than the recommended voltage range.

On the other hand, after the semiconductor memory device is installed in an electronic system, the external power voltage Vext in the recommended voltage range allows the internal power voltage Vint to be maintained substantially constant.

The peripheral circuits allow an external device (not shown) to write data into or read out the data from the memory cell array in a standard data access mode, and address signals at an address port AD causes the peripheral circuits to transfer the data between a memory address of the memory cell array and a data port DP. In this instance, the memory cell array and the peripheral circuits 22 as a whole constitute a main function block.

The semiconductor memory device embodying the present invention further comprises an internal reference voltage generator 23 for producing a reference voltage signal VR from the external power voltage Vext, a voltage premonitoring circuit 24 for producing an enable signal EBL1, a monitoring circuit 25 for producing a control signal Sdc and a built-in step-down voltage generator 26 for producing the internal power voltage Vint. The internal reference voltage generator 23 is similar to that of the prior art semiconductor memory device, and the reference voltage signal VR is substantially constant with respect to the external power voltage Vext in the recommended voltage range. However, while the external voltage Vext is rising toward the recommended voltage range, the internal reference voltage generator 23 also increases the reference voltage signal VR.

Figure 1:
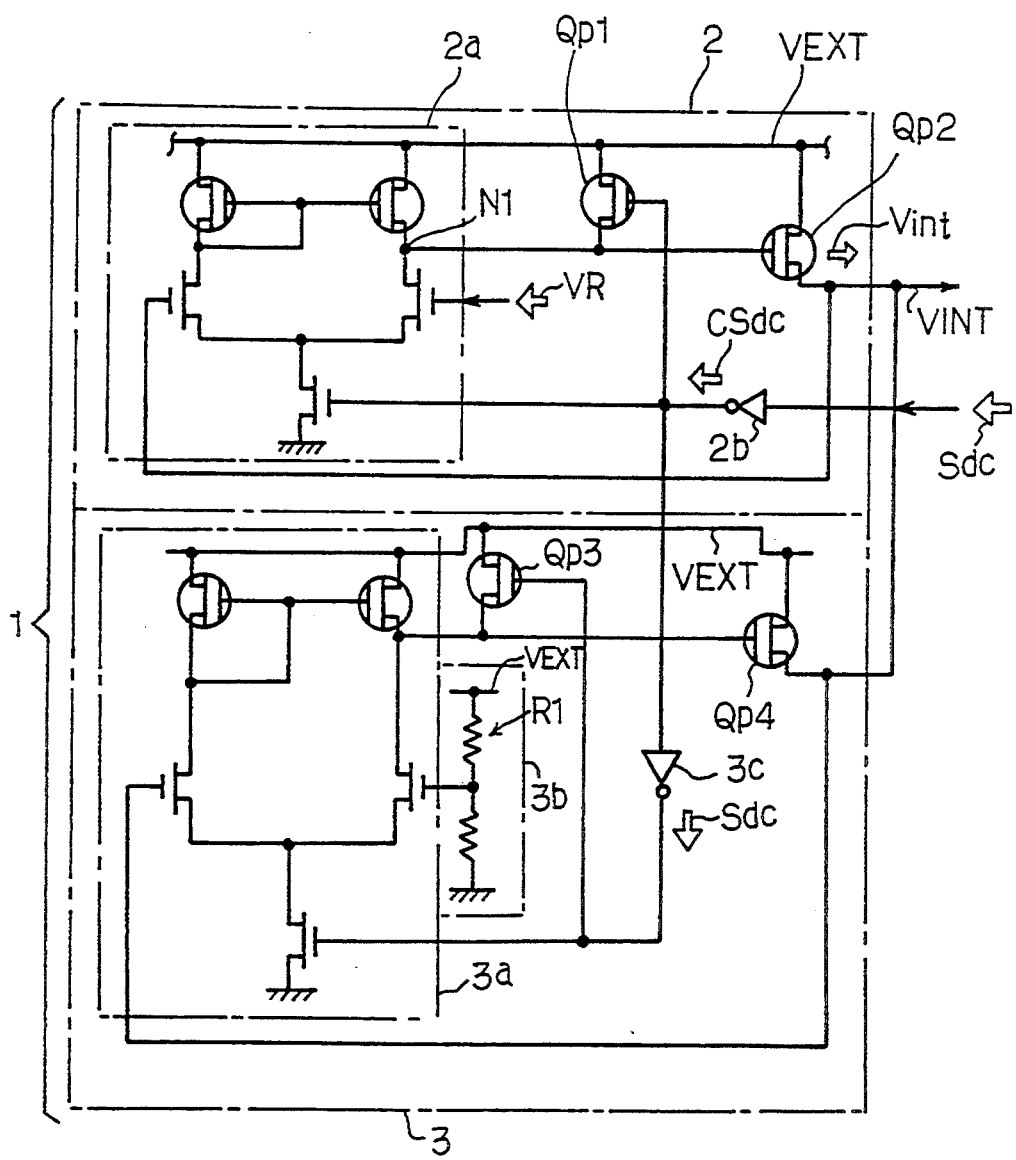
FIG. 1 is a circuit diagram showing the arrangement of the prior art built-in step-down power voltage generator incorporated in the prior art semiconductor memory device.
Figure 2:
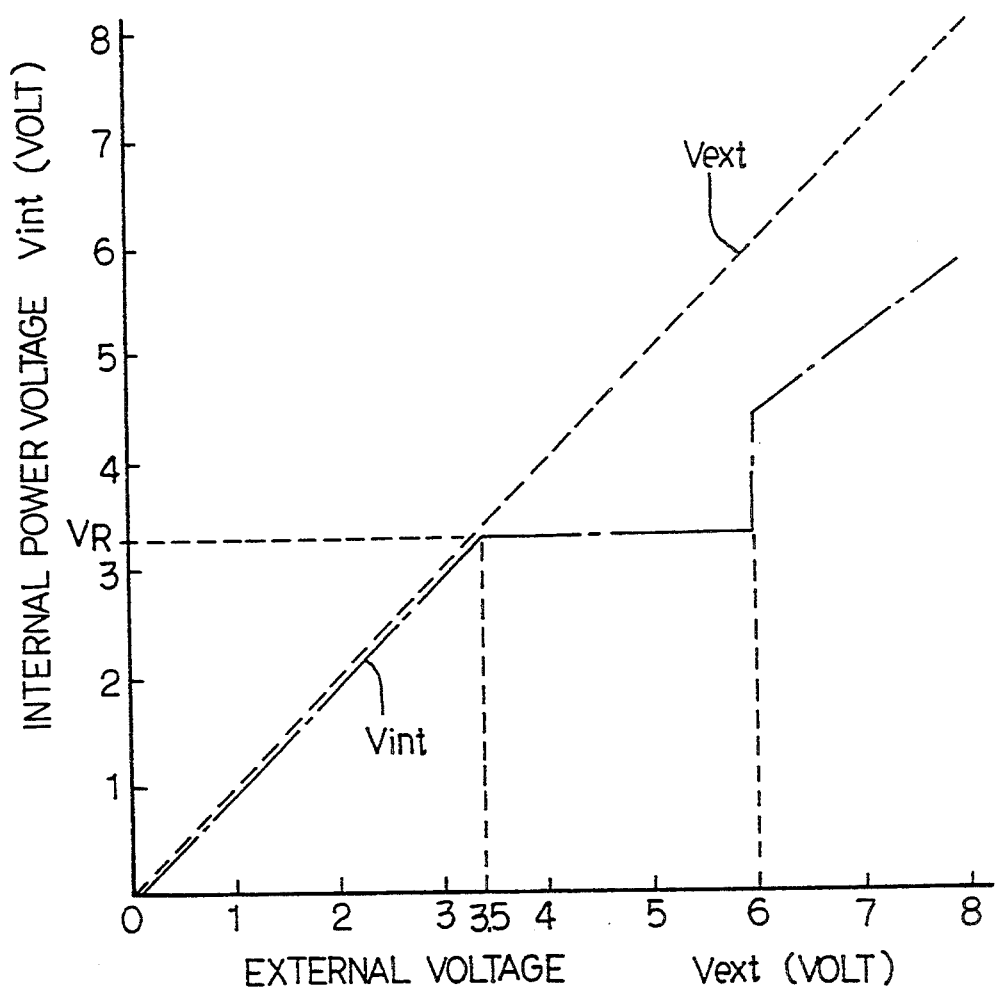
FIG. 2 is a graph showing the internal power voltage level in terms of the external voltage level.
Figure 3:
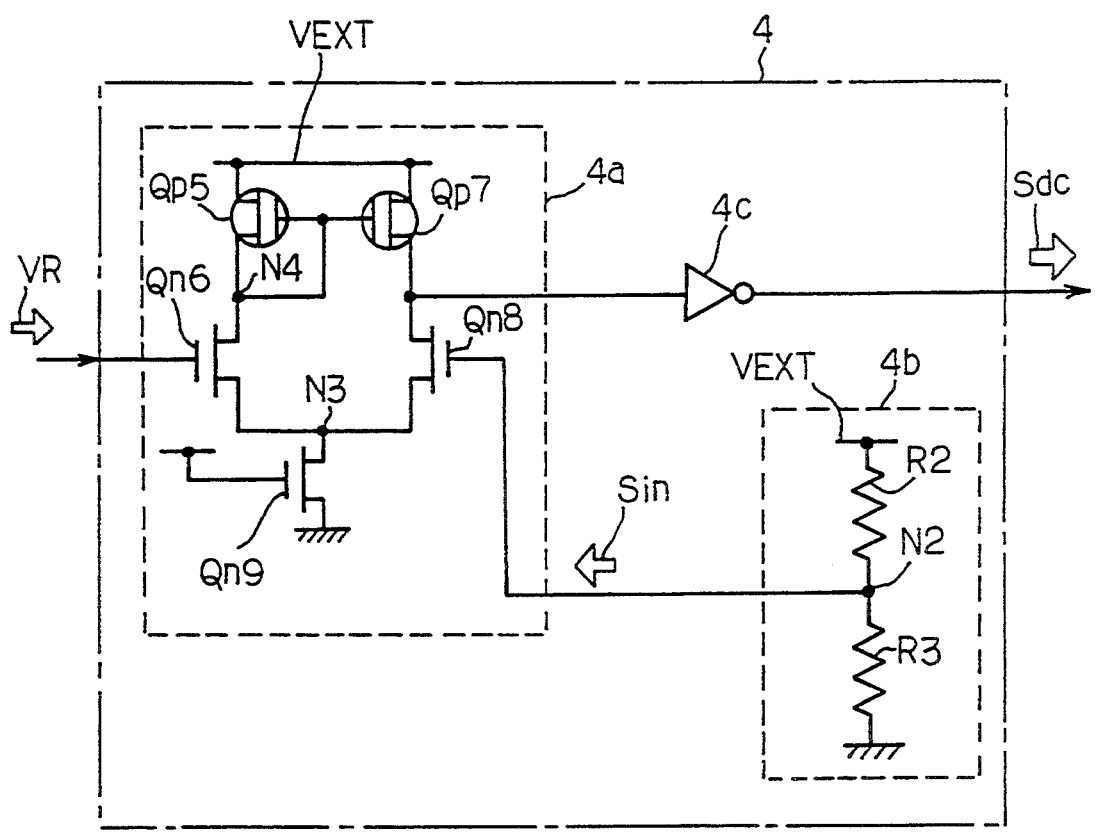
FIG. 3 is a circuit diagram showing the arrangement of the voltage monitoring circuit associated with the prior art built-in step-down power voltage generator.
Figure 4:
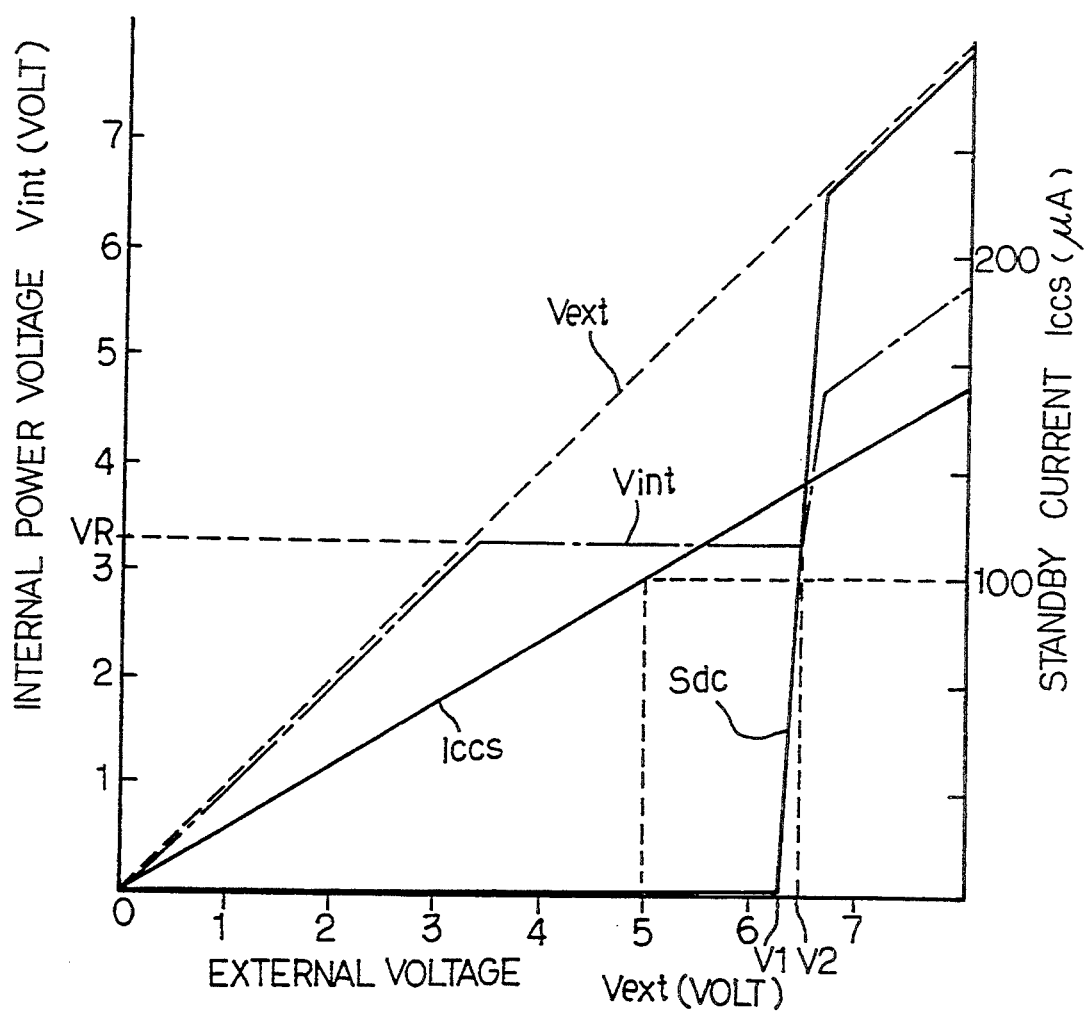
FIG. 4 is a graph showing the internal power voltage and the standby current in terms of the external voltage level.

The built-in step-down voltage generator 26 has a first internal voltage generating circuit available for the standard data access mode and a second internal voltage generating circuit available for the burn-in test operation. The first and second internal voltage generating circuits are similar in circuit arrangement to those of the prior art built-in step-down voltage generator shown in FIG. 1, and no further description is incorporated hereinbelow for the sake of simplicity.

The premonitoring circuit 24 comprises a p-channel enhancement type load transistor Qp11 providing a constant resistance against the reference voltage signal VR, a p-channel enhancement type load transistor Qp12 coupled at the source node thereof with the non-step-down power voltage line VEXT, a series combination of a p-channel enhancement type switching transistor Qp13 and a resistor R4 coupled between the p-channel enhancement type load transistor Qp12 and the resistor R4, and inverters 24a and 24b. The resistor R4 is much larger than the channel resistances of the p-channel enhancement type transistors Qp11 to Qp13, and allows only a small amount of current to pass therethrough.

The p-channel enhancement type switching transistor Qp13 is gated by the reference voltage signal VR supplied through the p-channel enhancement type load transistor Qp11, and the input node of the inverter 24a is coupled with the drain node N10 of the p-channel enhancement type switching transistor Qp13. The voltage level at the drain node N10 is twice inverted by the inverters 24a and 24b, and the enable signal EBL1 is supplied from the inverter 24b to the voltage monitoring circuit 25.

The voltage level at the source node N11 of the transistor Qp13 is given as "Vext− || Vtp12 ||" where Vth12 is the threshold of the p-channel enhancement type load transistor Qp12. Therefore, if the difference between the voltage levels at the source node N11 and the gate electrode i.e., "Vext− || Vtp12 || −VR" is less than the threshold of the p-channel enhancement type switching transistor Qp13, the p-channel enhancement type switching transistor Qp13 is turned off, and the drain node N10 is equal to the ground voltage level. This results in the enable signal of the inactive low voltage level.

However, if the external voltage Vext rises, the difference between the voltage levels at the source node N11 and the gate electrode becomes greater than the threshold, the p-channel enhancement type switching transistor Qp12 turns on, and the inverter 24b shifts the enable signal EBL1 to the active high voltage level. In this instance, the premonitoring circuit is adopted to exceed the difference between the voltage levels at the source node N11 and the gate electrode at a predetermined point Vpd (see FIG. 6) between the recommended voltage range and the accelerating voltage range.

The voltage monitoring circuit. 25 comprises a voltage comparator 25a implemented by a current mirror circuit, a voltage divider 25b for producing an input voltage signal Sin, a p-channel enhancement type pull-up transistor Qp14 and an inverter 25c. The voltage divider 25b is implemented by a series of resistors R5 and R6 and n-channel enhancement type switching transistor Qn15 coupled between the non-step-down power voltage line VEXT and the ground voltage line, and the enable signal EBL1 is supplied to the gate electrode of the n-channel enhancement type switching transistor Qn15.

If the enable signal EBL1 is in the inactive low voltage level, the n-channel enhancement type switching transistor Qn15 is turned off, and the input voltage signal Sin is as high as the external voltage Vext.

On the other hand, when the enable signal EBL1 is changed to an active high voltage level, the n-channel enhancement type switching transistor Qn15 turns on, and the input voltage signal Sin is varied in proportional to the external voltage Vext. The voltage level of the input voltage signal Sin is represented as "Vext×r5/(r5+r6)" where r5 and r6 are resistances of the resistors R5 and R6.

The p-channel enhancement type pull-up transistor Qp14 is coupled between the non-step-down power voltage line VEXT and an input node of the inverter 25c, and is gated by the enable signal EBL1. While the enable signal is in the inactive low voltage level, the p-channel enhancement type pull-up transistor Qp14 is turned on, and causes the inverter 25c to keep the control signal Sdc in the low voltage level. For this reason, the first internal voltage generating circuit of the built-in step-down voltage generator 26 is enabled with the complementary signal of the control signal Sdc, and supplies the internal power voltage Vint to the memory cell array and the peripheral circuits 22 in the recommended voltage range.

On the other hand, if the external voltage Vext starts to rise from the recommended voltage range toward the accelerating voltage range, the premonitoring circuit 24 notices the ascent of the external voltage Vext, and causes the p-channel enhancement type pull-up transistor Qp14 to turn off, thereby allowing the voltage comparator 25a to change the control signal Sdc through the inverter 25c.

The voltage comparator 25a comprises two series combinations of p-channel enhancement type load transistor Qp16/Qp17 and n-channel enhancement type load transistors Qn18/Qn19 coupled between the non-step-down power voltage line VEXT and a common node N12 and an n-channel enhancement type switching transistor Qn20 coupled between the common node N12 and the ground voltage line, and the p-channel enhancement type load transistors Qp16 and Qp17 are concurrently controlled by the common drain node N13 between the load transistors Qp16 and Qn18. The reference voltage signal VR and the input voltage signal Sin are supplied to the gate electrodes of the n-channel enhancement type load transistors Qn18 and Qn19, and the enable signal EBL1 is supplied to the gate electrode of the n-channel enhancement type switching transistor Qn20.

The enable signal EBL1 of the inactive low voltage level causes the n-channel enhancement type switching transistor Qn20 to turn off, and no current is consumed by the voltage comparator 25a.

On the other hand, when the external voltage Vext exceeds the predetermined level Vpd between the recommended voltage range and the accelerating voltage range, the enable signal EBL1 of the active high voltage level allows the n-channel enhancement type switching transistor Qn20 to turn on, and starts the voltage comparator 25a to compare the input voltage signal Sin with the reference voltage signal VR.

In this instance, while the reference voltage signal VR is higher than the input voltage signal Sin, the inverter 25c keeps the control signal Sdc in the low voltage level. When the input voltage signal Sin exceeds the reference voltage signal VR, the inverter changes the control signal Sdc to the high voltage level.

Figure 6:
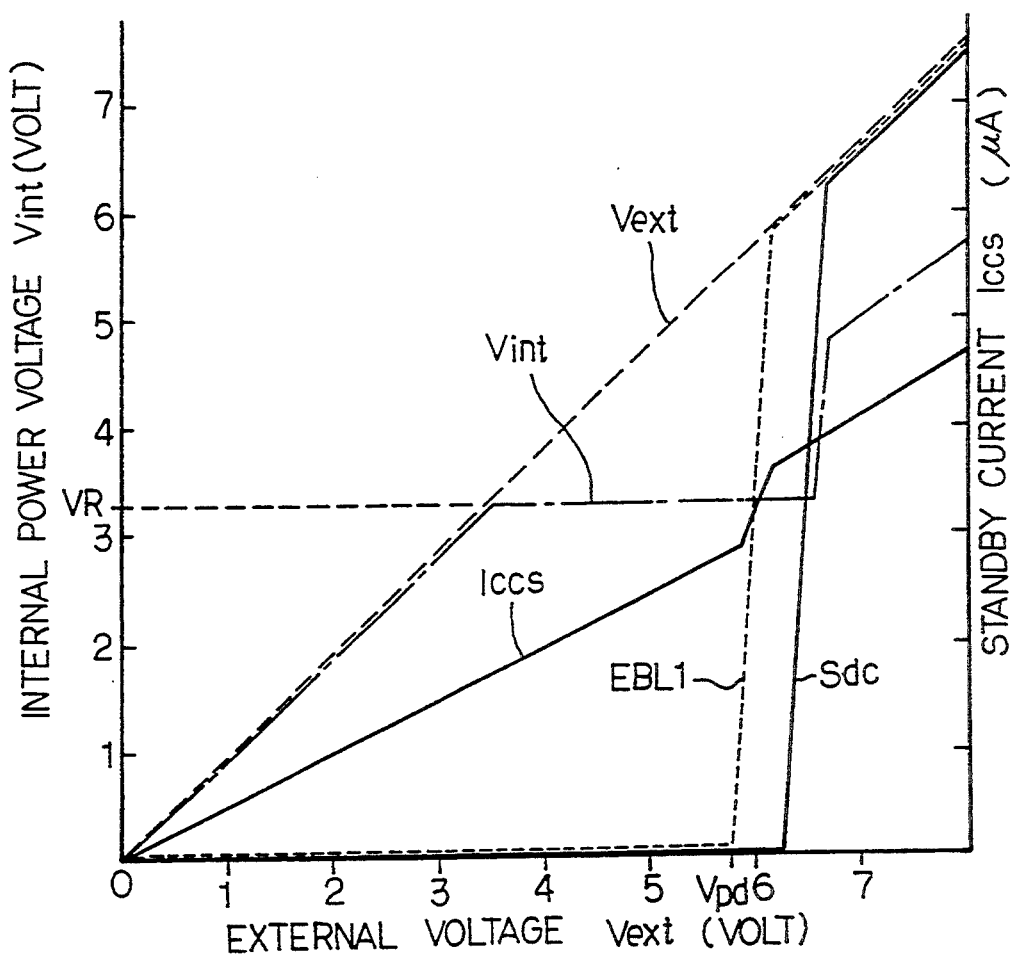
FIG. 6 is a graph showing an internal power voltage, an enable signal and a control signal of the semiconductor memory device in terms of an external voltage.

Assuming now that the semiconductor memory device embodying the present invention is subjected to the burn-in test operation, a diagnosis system increases the external voltage Vext as shown in FIG. 6, the premonitoring circuit 24 keeps the enable signal EBL1 in the low voltage level until the predetermined level Vpd between the recommended voltage range and the accelerating voltage range, and the p-channel enhancement type pull-up transistor Qp14 causes the inverter 25c to keep the control signal Sdc in the low voltage level. As a result, the first internal voltage generating circuit increases the internal power voltage Vint toward the reference voltage VR together with the external voltage Vext, and maintains the internal power voltage Vint at the reference voltage VR regardless of the external voltage Vext.

While the external voltage Vext is lower than the predetermined level Vpd between the recommended voltage range and the accelerating voltage range, the p-channel enhancement type switching transistor Qp13 and the n-channel enhancement switching transistors Qn15 and Qn20 are turned off, and the premonitoring circuit 24 and the voltage monitoring circuit 25 do not consume current. Although the standby current Iccs in increased together with the external voltage Vext, the current consumption is smaller than that of the prior art.

When the external voltage Vext exceeds the predetermined level Vpd, the p-channel enhancement type switching transistor Qp13 turns on, and allows the inverter 24b to shift the enable signal EBL1 to the active high voltage level. As a result, the p-channel enhancement type pull-up transistor Qp14 turns off, and the n-channel enhancement type switching transistors Qn15 and Qn20 turn on. Then, the voltage comparator 25a and the voltage divider 25b are enabled so as to compare the input voltage signal Sin with the reference voltage signal VR. The voltage comparator 25a and the voltage divider 25b consumes current, and the standby current Iccs is rapidly increased at the predetermined level Vpd.

When the external voltage Vext enters into the accelerating voltage range, the input voltage signal Sin exceeds the reference voltage signal VR, and the inverter 25c changes the control signal Sdc to the high voltage level. With the control signal Sdc of the high voltage level, the second internal voltage generating circuit proportionally increases the internal power voltage Vint, and the diagnostic system carries out the burn-in test operation on the semiconductor memory device.

When the semiconductor memory device serves as a data storage in an electronic system, the electronic system applies the external voltage Vext in the recommended voltage range, and the premonitoring circuit 24 keeps the enable signal EBL1 in the inactive low voltage level. For this reason, the premonitoring circuit 24 and the voltage monitoring circuit 25 do not consume current, and the standby current is decreased.

Second Embodiment

Figure 7:
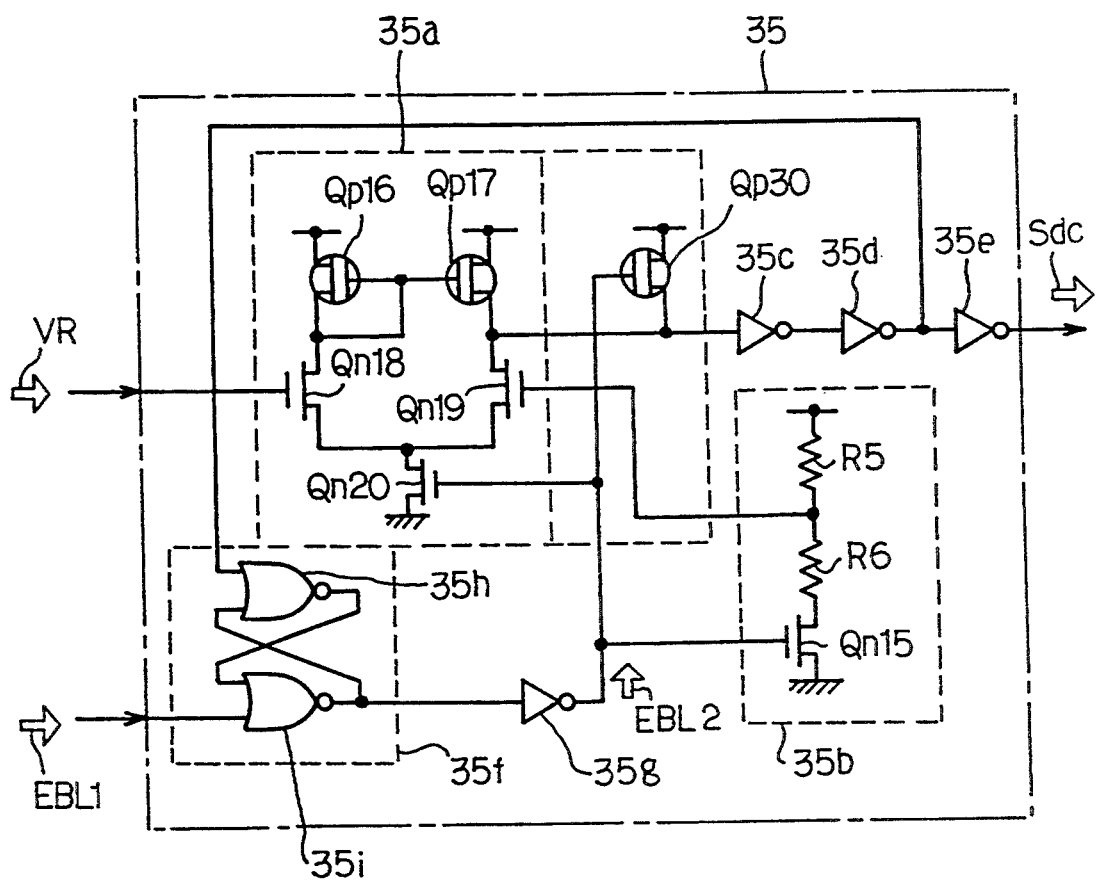
FIG. 7 is a circuit diagram showing the arrangement of a voltage monitoring circuit incorporated in the semiconductor memory device.

Turning to FIG. 7 of the drawings, a voltage monitoring circuit 35 is incorporated in another semiconductor memory device embodying the present invention. The semiconductor memory device implementing the second embodiment is similar to the first embodiment except for the voltage monitoring circuit 35, and the other component units are not described hereinbelow for the sake of simplicity.

The voltage monitoring circuit 35 comprises a voltage comparator 35a, a voltage divider 35b, a p-channel enhancement type pull-up transistor Qp30, a series of inverters 35c, 35d and 35e, a latch circuit 35f and an inverter 35g. The voltage comparator 35a and the voltage divider 35b are similar in circuit arrangement to those of the first embodiment, and the circuit components are labeled with the same references as those of the first embodiment without detailed description.

The latch circuit 35f is implemented by two NOR gates 35h and 35i, and output nodes of the NOR gates 35h and 35i are connected with first input nodes of the NOR gates 35i and 35h. The enable signal EBL1 is supplied to the second input node of the NOR gate 35i, and the output node of the inverter 35d is connected with the second input node of the NOR gate 35h. The latch circuit 35f causes the inverter 35g to produce a secondary enable signal EBL2, and the secondary enable signal EBL2 is supplied to the gate electrode of the p-channel enhancement type pull-up transistor Qp30 and the gate electrode of the n-channel enhancement type switching transistor Qn15.

In this instance, the latch circuit 35f and the inverter 35g as a whole constitute a latch means.

Figure 8:
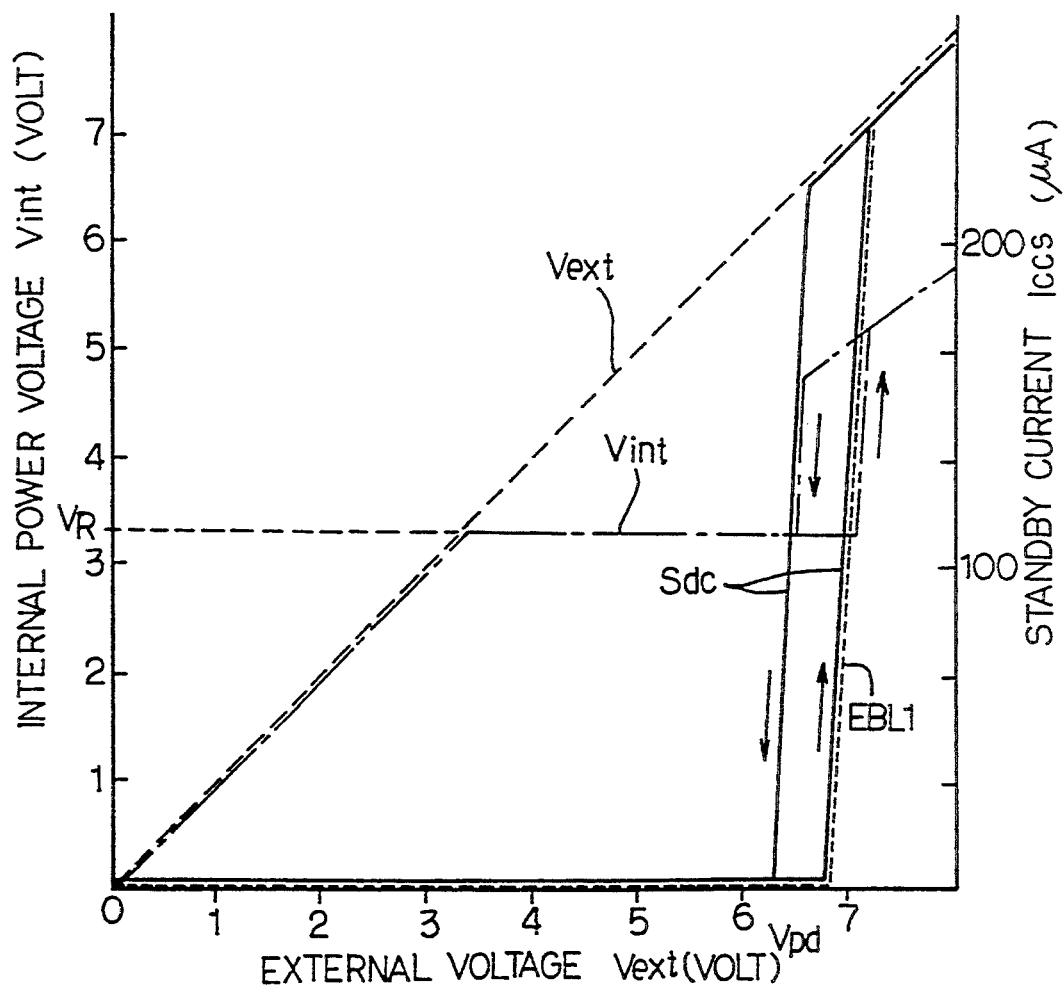
FIG. 8 is a graph showing an internal power voltage, an enable signal and a control signal in terms of an external voltage.

While the external voltage Vext is rising toward the predetermined level Vpd, the premonitoring circuit 24 keeps the enable signal EBL1 in the low level as shown in FIG. 8, and the inverter 35d supplies a high-level signal to the NOR gate 35h. As a result, the NOR gate 35h supplies the low-level signal to the other NOR gate 35i, and the NOR gate 35i yields a high-level signal. For this reason, the inverter 35g keeps the secondary enable signal EBL2 in the low voltage level, and the voltage comparator 35a and the voltage divider 35b are disabled.

When the external voltage Vext exceeds the predetermined level Vpd, the premonitoring circuit 24 changes the enable signal EBL1 to the high level, and the NOR gate 35i changes output signal to the low level. As a result, the inverter 35g changes the secondary enable signal EBL2 to the high voltage level, and the voltage comparator 35a and the voltage divider 35b are enabled.

On the other hand, the p-channel enhancement type pull-up transistor Qp30 turns off, and the voltage comparator 35a starts to compare the input voltage signal Sin with the reference voltage signal VR.

When the input voltage signal Sin exceeds the reference voltage signal VR, the voltage comparator 35a changes the output signal thereof to the low voltage level, and the control signal Sdc is changed to the high voltage level. This results in that the second internal voltage generating circuit is enabled so that the internal power voltage Vint starts to rise together with the external voltage Vext.

The inverter 35d feeds back a low-level signal to the NOR gate 35h. The NOR gate 35h supplies a high-level signal to the NOR gate 35i, and the NOR gate 35i fixes the output signal to the low voltage level.

Even if the external voltage Vext becomes lower than the predetermined level Vpd and, accordingly, the premonitoring circuit 24 changes the enable signal EBL1 to the low voltage level, the NOR gate 35i keeps the output signal in the low level until the external voltage Vext is removed.

Thus, after the external voltage Vext exceeds the reference voltage signal VR, the voltage monitoring circuit 35 keeps the control signal Sdc in the high voltage level regardless of the enable signal EBL1. The voltage monitoring circuit 35 thus arranged is desirable for a diagnostic system, because the diagnostic system can change the external voltage Vext across the predetermined level Vpd in the inspection mode. In other words, the diagnostic system can carry out the burn-in test operation under various external voltage levels.

As will be appreciated from the foregoing description, the semiconductor integrated circuit device equipped with the built-in step-down voltage generator can be examined through the burn-in test operation without sacrifice of standby current in the standard data access mode.

Although particular embodiments of the present invention have been shown and described, it will be obvious to those skilled in the art that various changes and modifications may be made without departing from the spirit and scope of the present invention. For example, the dynamic random access memory device may form a part of an ultra large scale integration, and the voltage monitoring circuit may be incorporated in a semiconductor integrated circuit device except for a memory.

What is claimed is:

1. A semiconductor integrated circuit device selectively entering into a standard operation mode powered with an external voltage variable within a standard voltage range and an inspection mode powered with said external voltage in an accelerating voltage range over said standard voltage range, comprising:
   a) a main function block powered with at least an internal power voltage;
   b) a reference voltage generator powered with said external voltage for producing a reference voltage signal maintained substantially constant after said external voltage reaches said standard voltage range;
   c) a premonitoring circuit operative to compare said external voltage with said reference voltage signal whether or not said external voltage exceeds a predetermined level between said standard voltage range and said accelerating voltage range, said premonitoring circuit keeping an enable signal in an inactive level before said external voltage exceeds said predetermined voltage level, said premonitoring circuit changing said enable signal to an active level when said external voltage exceeds said predetermined voltage level;
   d) a voltage monitoring circuit enabled with said enable signal for comparing an input voltage signal indicative of the level of said external voltage with said reference voltage signal, and operative to shift a control signal from an inactive level to an active level when input voltage signal indicates that said external voltage reaches said accelerating voltage range, said voltage monitoring circuit keeping said control signal in said inactive level without current consumption while the enable signal is in said inactive level; and
   e) a step-down voltage generating circuit operative to keep said internal power voltage substantially constant while said control signal is in said inactive level, said step-down voltage generating circuit being responsive to said control signal of said active level for increasing said internal power voltage together with said external voltage.

2. The semiconductor integrated circuit device as set forth in claim 1, in which said voltage monitoring circuit has a current mirror circuit coupled between an external voltage source and a constant voltage source and enabled with said enable signal of said active level for comparing said input voltage signal with said reference voltage signal.

3. The semiconductor integrated circuit device as set forth in claim 2, in which said current mirror circuit comprises
   a series combination of a first load transistor of a first channel conductivity type and a second load transistor of a second channel conductivity type opposite to said first channel conductivity type coupled between said external voltage source and a common node, said second load transistor being gated by said reference voltage signal,
   a series combination of a third load transistor of said first channel conductivity type and a fourth load transistor of said second channel conductivity type coupled between said external voltage source and said common node, said first and third load transistors being controlled by a voltage level at a control node between said first load transistor and said second load transistor, said fourth load transistor being gated by said input voltage signal, and
   a switching transistor of said second channel conductivity type coupled between said common node and said constant voltage source, and switched between on-state and off-state by said enable signal.

4. The semiconductor integrated circuit device as set forth in claim 2, in which said voltage monitoring circuit further has
   a voltage divider coupled between said external voltage source and said constant voltage source, and enabled with said enable signal of said active level for producing said input voltage signal, and
   a pull-up transistor coupled between said external voltage source and an output node of said current mirror circuit, and causing said voltage monitoring circuit to produce said control signal of said inactive level while said enable signal is in said inactive level.

5. The semiconductor integrated circuit device as set forth in claim 4, in which said voltage monitoring circuit further has
   a latch means operative to latch said enable signal of said active level when said control signal is changed to said active level, and continuously supplying said enable signal of said active level regardless of the voltage level of said external voltage.

6. The semiconductor integrated circuit device as set forth in claim 1, in which said premonitoring circuit comprises
   a series combination of a load transistor, a switching transistor and a load element coupled between an external voltage source and a constant voltage source, said switching transistor being gated by said reference voltage signal, and
   a logic circuit coupled with a node between said switching transistor and said load element for producing said enable signal.

* * * * *